(12) United States Patent
Shin et al.

(10) Patent No.: US 10,396,250 B2
(45) Date of Patent: Aug. 27, 2019

(54) LIGHT EMITTING ELEMENT INCLUDING ZNO TRANSPARENT ELECTRODE

(71) Applicant: SEOUL VIOSYS CO., LTD., Ansan-si (KR)

(72) Inventors: Chan Seob Shin, Ansan-si (KR); Myoung Hak Yang, Ansan-si (KR); Yeo Jin Yoon, Ansan-si (KR); Seom Geun Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/870,687

(22) Filed: Jan. 12, 2018

(65) Prior Publication Data

US 2018/0138370 A1    May 17, 2018

Related U.S. Application Data

(63) Continuation of application No. PCT/KR2016/006857, filed on Jun. 27, 2016.

(30) Foreign Application Priority Data

Jul. 15, 2015  (KR) .......................... 10-2015-0100193

(51) Int. Cl.
*H01L 33/42* (2010.01)
*H01L 33/20* (2010.01)
(Continued)

(52) U.S. Cl.
CPC .............. *H01L 33/42* (2013.01); *H01L 33/20* (2013.01); *H01L 33/22* (2013.01); *H01L 33/38* (2013.01)

(58) Field of Classification Search
CPC ..................................... H01L 33/0004–33/648
See application file for complete search history.

(56) References Cited

U.S. PATENT DOCUMENTS

| 9,847,457 B2* | 12/2017 | Chae ........................ H01L 33/38 |
| 2005/0277218 A1* | 12/2005 | Nakajo ................... H01L 33/20 |
| | | 438/46 |
| 2007/0018183 A1 | 1/2007 | Denbaars |

FOREIGN PATENT DOCUMENTS

| JP | 2005-252253 A | 9/2005 |
| KR | 10-2010-0066879 A | 6/2010 |

(Continued)

OTHER PUBLICATIONS

International Search Report in International Application No. PCT/KR2016/006857, dated Nov. 2, 2016.

*Primary Examiner* — Cuong B Nguyen
(74) *Attorney, Agent, or Firm* — Perkins Coie LLP

(57) ABSTRACT

An exemplary light emitting diode is provided to comprise: a first semiconductor layer; a mesa disposed on the first semiconductor layer and including an active layer and a second semiconductor layer disposed on the active layer; a ZnO transparent electrode disposed on the mesa; a first electrode disposed on the first semiconductor layer; and a second electrode disposed on the ZnO transparent electrode, and including a second electrode pad and at least one second electrode extending portion extending from the second electrode pad. The second electrode extending portion contacts the ZnO transparent electrode. The ZnO transparent electrode includes a first region and a second region. The first region protrudes from the top surface of the ZnO transparent electrode, includes a plurality of projecting portions arranged in a predetermined pattern, the thickness of the first region greater than the thickness of the second region.

18 Claims, 10 Drawing Sheets

(51) Int. Cl.
*H01L 33/22* (2010.01)
*H01L 33/38* (2010.01)

(56) References Cited

FOREIGN PATENT DOCUMENTS

| KR | 10-2011-0084645 A | 7/2011 |
| KR | 10-2015-0004565 A | 1/2015 |

* cited by examiner (a)  (b)

(c)

LIGHT EMITTING ELEMENT INCLUDING ZnO TRANSPARENT ELECTRODE

CROSS-REFERENCE TO RELATED APPLICATION(S)

This patent document claims priority to and the benefits of PCT Application No. PCT/KR2016/006857, filed on Jun. 27, 2016, which further claims the priority to and benefits of Korean Patent Application No. 10-2015-0100193, filed on Jul. 15, 2015. The above patent documents are incorporated herein by reference for all purposes.

TECHNICAL FIELD

Exemplary embodiments of the present disclosure relate to a light emitting element, and more particularly, to a light emitting element that includes ZnO transparent electrode including a plurality of protrusions and has improved luminous efficacy and electrical characteristics.

BACKGROUND

A light emitting device is a semiconductor device emitting light by a recombination of electrons and holes. Recently, the light emitting device has been variously used in a display apparatus, a vehicle lamp, lighting apparatuses, optical communication equipments, etc.

Exemplary embodiments of the present disclosure provide a light emitting element that includes a ZnO transparent electrode having low electrical resistance to improve current spreading efficiency.

Exemplary embodiments of the present disclosure provide a light emitting element that has improved light extraction efficiency through surface patterning of the ZnO transparent electrode.

SUMMARY

Exemplary embodiments of the present disclosure provide a light emitting element that has improved electrical characteristics through control of surface morphology of the ZnO transparent electrode.

In accordance with one aspect of the present disclosure, a light emitting element includes: a first conductivity type semiconductor layer; a mesa disposed on the first conductivity type semiconductor layer and including an active layer and a second conductivity type semiconductor layer disposed on the active layer; a ZnO transparent electrode disposed on the mesa; a first electrode disposed on the first conductivity type semiconductor layer; and a second electrode at least partially disposed on the ZnO transparent electrode, and including a second electrode pad and at least one second electrode extension portion extending from the second electrode pad, wherein the second electrode extension portion contacts the ZnO transparent electrode, the ZnO transparent electrode includes a first region and a second region, the first region includes a plurality of protrusions protruding upwards from an upper surface of the ZnO transparent electrode and arranged in a predetermined pattern, a portion corresponding to a height of the plurality of protrusions has a larger thickness than the second region, and a separation distance between the plural protrusions is smaller than the shortest distance from the second electrode extension portion to one protrusion adjacent the second electrode extension portion in a horizontal direction.

The maximum thickness of the first region of the ZnO transparent electrode may be two to six times the thickness of the second region of the ZnO transparent electrode.

The second region of the ZnO transparent electrode may have a thickness of 250 nm or more.

The second region of the ZnO transparent electrode may have a thickness of 300 nm to 500 nm.

The protrusions of the ZnO transparent electrode may have a thickness of 1 µm to 1.5 µm.

A diameter of a lower surface of each of the protrusions or an inscribed circle with respect to the lower surface of each of the protrusions may be 1.5 to 3 times the separation distance between the protrusions.

The lower surface of each of the protrusions or the inscribed circle with respect to the lower surface of each of the protrusions may have a diameter of 1 µm to 3 µm.

A portion of the ZnO transparent electrode disposed under the second electrode extension portion may have a larger thickness than an average thickness of the ZnO transparent electrode.

A portion of the ZnO transparent electrode disposed under the second electrode extension portion may have the same thickness as the first region of the ZnO transparent electrode.

The light emitting element may further include a current blocking layer interposed between the mesa and the ZnO transparent electrode, wherein the current blocking layer may include a pad current blocking layer disposed under the second electrode pad and an extension portion current blocking layer disposed under the second electrode extension portion.

The extension portion current blocking layer may be covered by the ZnO transparent electrode, the pad current blocking layer may be partially covered by the ZnO transparent electrode, and a portion of the ZnO transparent electrode may be interposed between the second electrode pad and the pad current blocking layer.

The portion of the ZnO transparent electrode interposed between the second electrode pad and the pad current blocking layer may have a larger thickness than an average thickness of the ZnO transparent electrode.

The light emitting element may further include a passivation layer covering at least part of an upper surface of the light emitting structure and the ZnO transparent electrode.

A portion of the passivation layer disposed on the second region of the ZnO transparent electrode may have a larger thickness than a portion of the passivation layer disposed on the first region of the ZnO transparent electrode.

The second region may correspond to a portion of the ZnO transparent electrode on which the protrusions are not formed.

In accordance with another aspect of the present invention, a light emitting element includes: a first conductivity type semiconductor layer; a mesa disposed on the first conductivity type semiconductor layer, and including an active layer and a second conductivity type semiconductor layer disposed on the active layer; a ZnO transparent electrode disposed on the mesa; a first electrode insulated from the second conductivity type semiconductor layer and disposed on the first conductivity type semiconductor layer; and a second electrode at least partially disposed on the ZnO transparent electrode, and including a second electrode pad and at least one second electrode extension portion extending from the second electrode pad, wherein the second electrode extension portion contacts the ZnO transparent electrode, and the ZnO transparent electrode includes a first region and a second region, the first region including a plurality of protrusions protruding upwards from an upper surface of the ZnO transparent electrode and arranged in a predetermined pattern, the first region not overlapping a region surrounded by a side surface of the second electrode extension portion and an imaginary boundary separated a predetermined distance from the side surface of the second electrode extension portion in a horizontal direction, the predetermined distance being greater than a separation distance between the protrusions.

The second region may have a smaller thickness than a height of the plurality of protrusions.

The predetermined distance may be smaller than or equal to the shortest distance from the second electrode extension portion to one protrusion adjacent the second electrode extension portion in a horizontal direction.

Exemplary embodiments of the present disclosure provide a light emitting element that includes a transparent electrode including a ZnO transparent electrode having relatively high light transmittance and having a larger thickness than an ITO transparent electrode. With this structure, the light emitting element can improve lateral current spreading efficiency in the transparent electrode. Further, the transparent electrode has a relatively thick thickness to allow formation of protrusions thereon, thereby improving light extraction efficiency through the protrusions.

DETAILED DESCRIPTION

Figure 1:
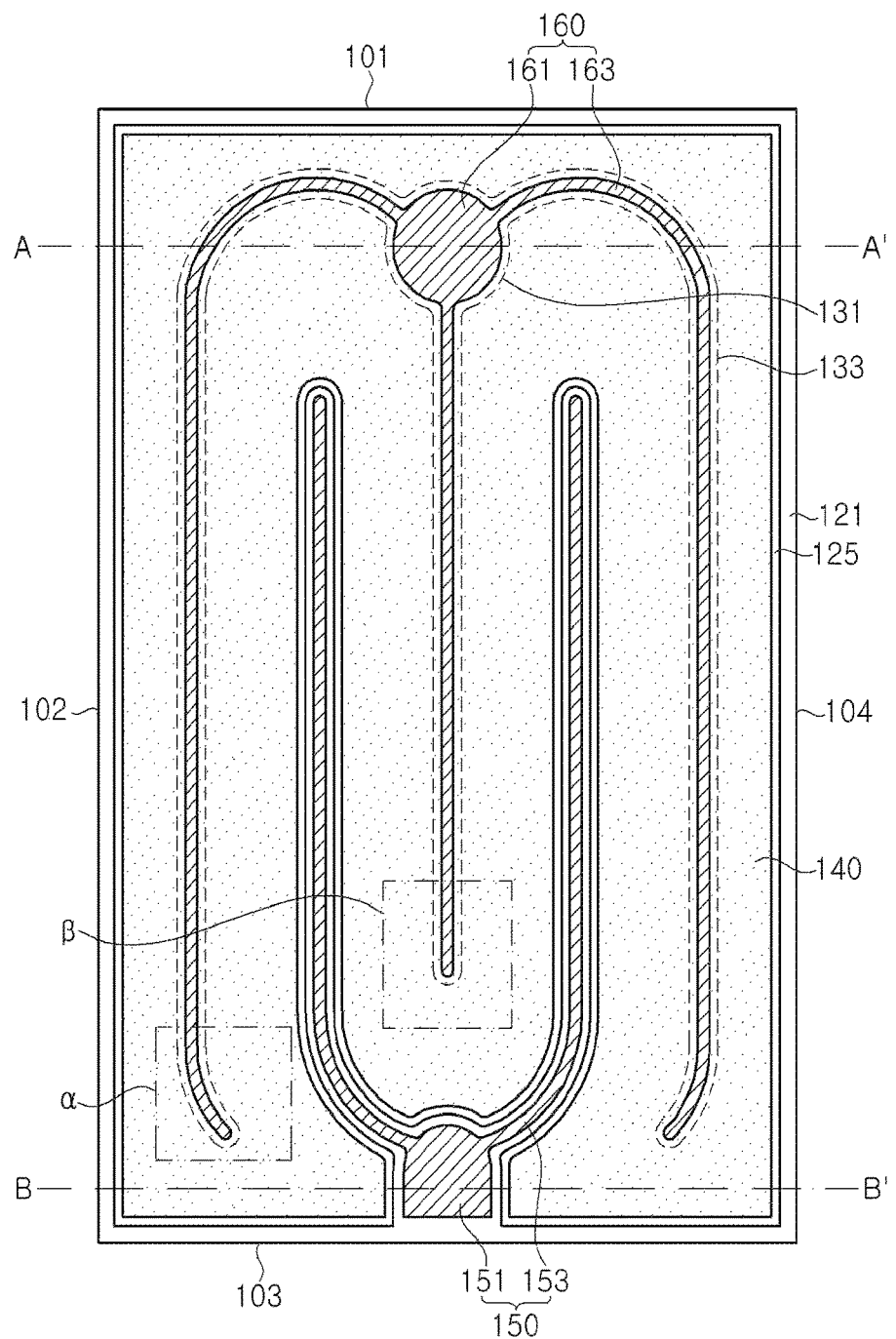
FIG. 1 is a plan view of an exemplary light emitting element according to one exemplary embodiment of the present disclosure.

Hereinafter, exemplary embodiments of the present disclosure will be described in detail with reference to the accompanying drawings. The following embodiments are provided by way of example Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In a light emitting diode including nitride semiconductors, a p-type nitride semiconductor layer has lower electrical conductivity than an n-type nitride semiconductor layer. As a result, electric current is not efficiently spread in the horizontal direction in the p-type semiconductor layer, thereby causing current crowding at a certain portion of the semiconductor layer. When current crowding occurs in the semiconductor layer, the light emitting diode becomes vulnerable to electrostatic discharge and can suffer from current leakage and efficiency drooping. Moreover, the p-type semiconductor layer is not likely to form ohmic contact with a metallic electrode and exhibits higher contact resistance thereto, as compared with the n-type semiconductor layer.

Accordingly, in manufacture of a light emitting element, an ITO transparent electrode and a current blocking layer may be formed on the p-type semiconductor layer in order to improve efficiency in current spreading and ohmic contact. However, there are limitations in achieving uniform current spreading throughout the p-type semiconductor layer only by formation of the current blocking layer and the ITO transparent electrode. Particularly, ITO has a limitation in thickness increase due to deterioration in light transmittance with increasing thickness, thereby providing restriction in current spreading due to relatively high resistance in the horizontal direction within ITO.

Figure 2:
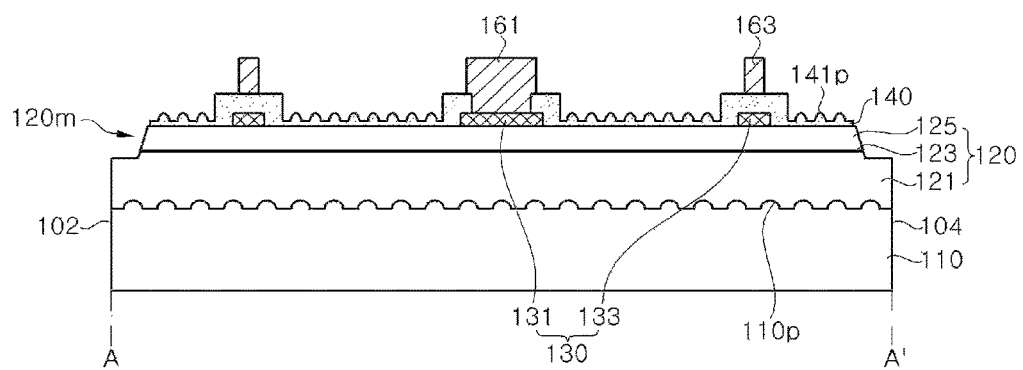
FIG. 2 and FIG. 3 are exemplary cross-sectional views of the light emitting element according to the exemplary embodiment of the present disclosure.
Figure 3:
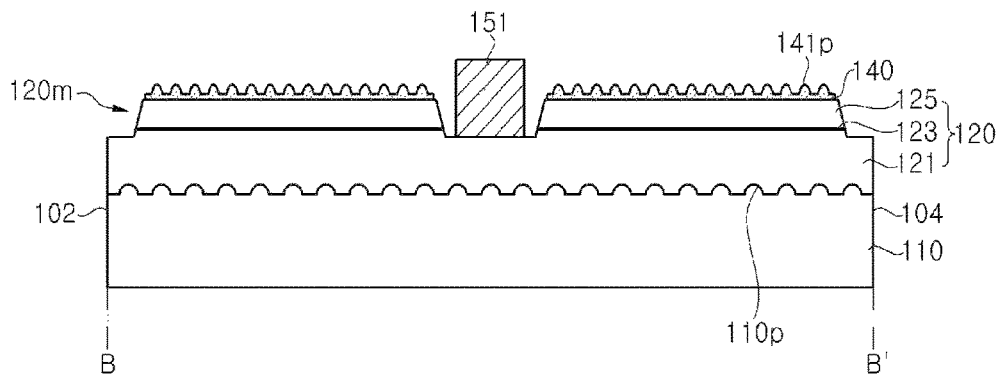
Figure 4:
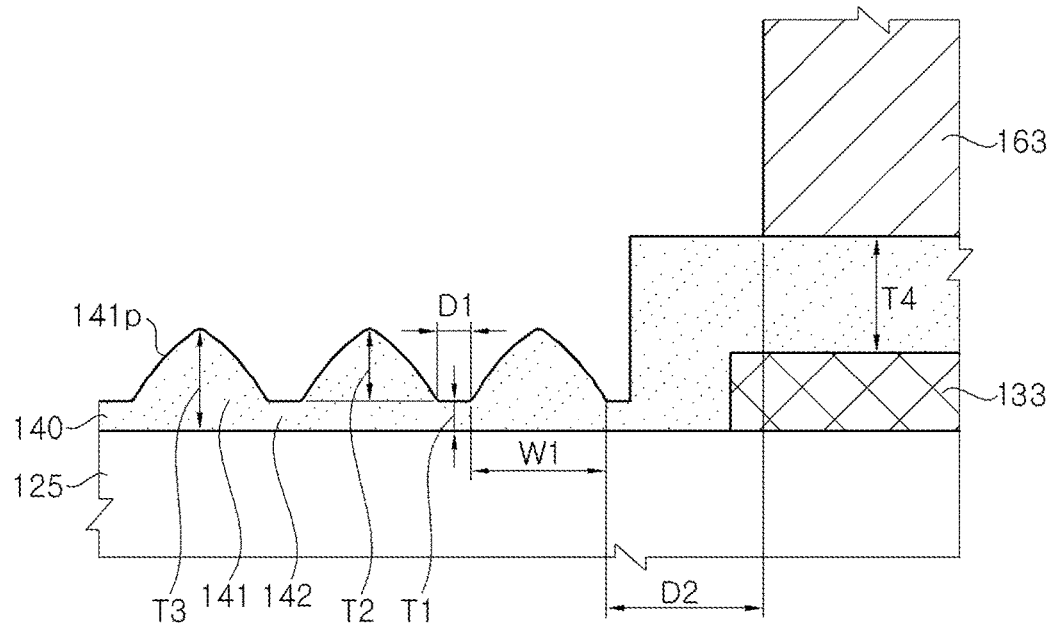
FIG. 4 is an enlarged cross-sectional view of an exemplary light emitting element according to the exemplary embodiment of the present disclosure.
Figure 5:
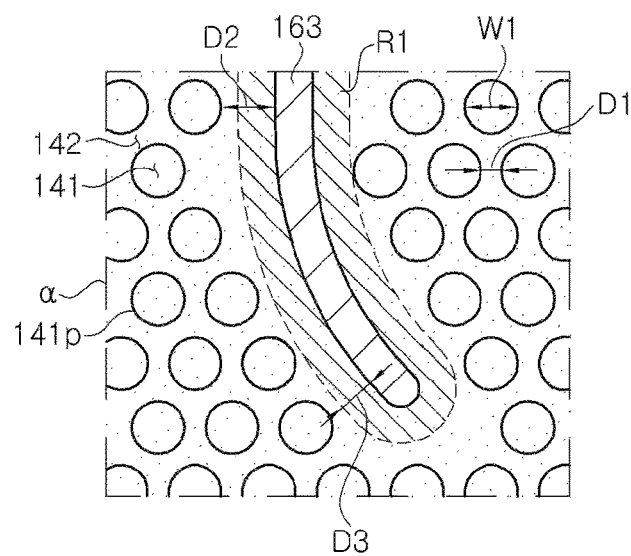
FIG. 5 and FIG. 6 are enlarged plan views of an exemplary light emitting element according to the exemplary embodiment of the present disclosure.
Figure 6:
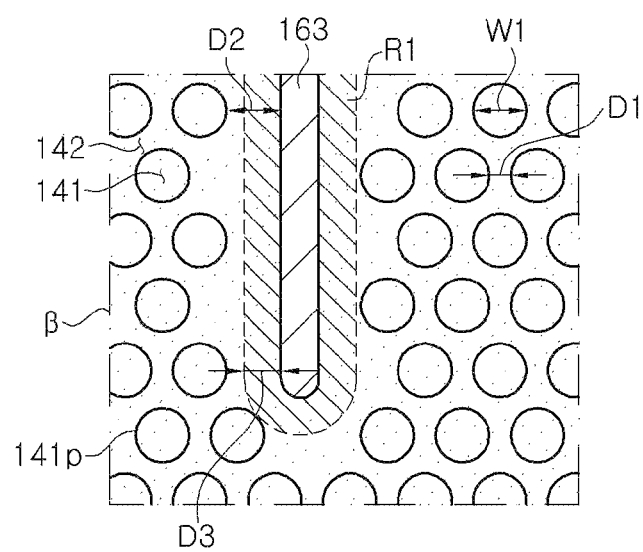
Figure 7:
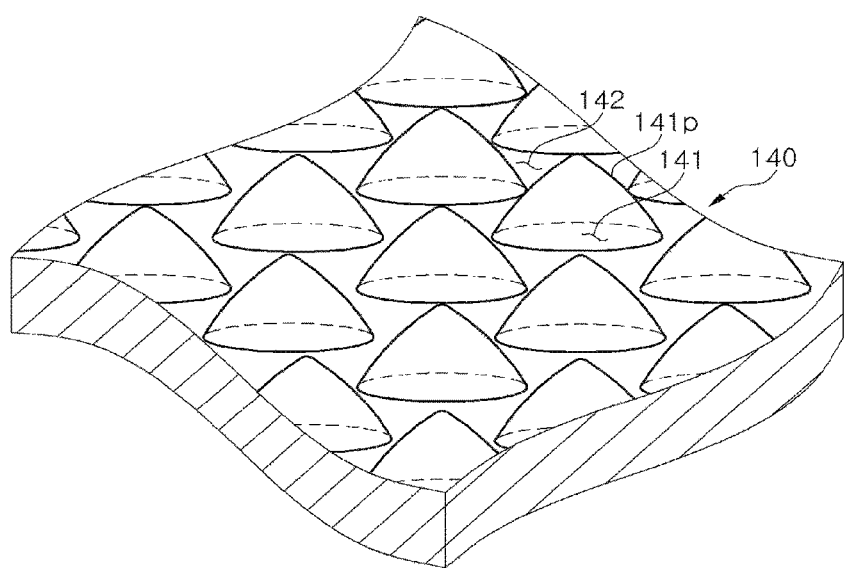
FIG. 7 is an enlarged perspective view of an exemplary light emitting element according to the exemplary embodiment of the present disclosure.

Hereinafter, a light emitting element according to one exemplary embodiment of the present disclosure will be described with reference to FIG. 1 to FIG. 7. FIG. 1 is a plan view of a light emitting element according to one exemplary embodiment of the present disclosure and FIG. 2 and FIG. 3 are cross-sectional views taken along lines A-A' and B-B' of FIG. 1. FIG. 4 is an enlarged cross-sectional view of the light emitting element shown in FIG. 2. FIG. 5 and FIG. 6 are enlarged plan views of Regions α and β of FIG. 1. FIG. 7 is an enlarged perspective view of the light emitting element according to the exemplary embodiment of the present disclosure, showing a surface morphology of a ZnO transparent electrode.

Referring to FIG. 1 to FIG. 7, the light emitting element includes a light emitting structure 120, a current blocking layer 130, a transparent electrode 140, a first electrode 150, and a second electrode 160. The light emitting element may further include a substrate 110. In addition, the light emitting element may include first to fourth side surfaces 101, 102, 103, 104. As shown in the drawings, the light emitting element may have a rectangular shape with different aspect ratios in plan view, without being limited thereto.

The substrate 110 may be an insulating or conductive substrate. In addition, the substrate 110 may be a growth substrate for growing the light emitting structure 120, and may include a sapphire substrate, a silicon carbide substrate, a silicon substrate, a gallium nitride substrate, an aluminum nitride substrate, or others. Alternatively, the substrate 110 may be a secondary substrate for supporting the light emitting structure 120. For example, the substrate 110 may be a sapphire substrate, particularly, a patterned sapphire substrate (PSS) having an upper surface subjected to patterning. In this case, the substrate 110 may include a plurality of protrusions 110p formed on the upper surface thereof.

In this exemplary embodiment, a first conductivity type semiconductor layer 121 is disposed on the substrate 110. In other exemplary embodiments, the substrate 110 may be a growth substrate that allows growth of semiconductor layers 121, 123, 125 thereon, and can be removed through physical and/or chemical processes after growth of the semiconductor layers 121, 123, 125 thereon.

The light emitting structure 120 includes the first conductivity type semiconductor layer 121, a second conductivity type semiconductor layer 125 disposed on the first conductivity type semiconductor layer 121, and an active layer 123 interposed between the first conductivity type semiconductor layer 121 and the second conductivity type semiconductor layer 125. In addition, the light emitting structure 120 may include a mesa 120m disposed on the first conductivity type semiconductor layer 121 and including the active layer 123 and the second conductivity type semiconductor layer 125.

The first conductivity type semiconductor layer 121, the active layer 123 and the second conductivity type semiconductor layer 125 may include III-V based nitride semiconductors, for example, nitride semiconductors such as (Al, Ga, In)N. The first conductivity type semiconductor layer 121, the active layer 123 and the second conductivity type semiconductor layer 125 may be grown in a chamber through any known process, such as MOCVD. In addition, the first conductivity type semiconductor layer 121 may include n-type dopants (for example, Si, Ge, Sn) and the second conductivity type semiconductor layer 125 may include p-type dopants (for example, Mg, Sr, Ba), or vice versa. The active layer 123 may have a multi-quantum well (MQW) structure and the composition of the active layer may be determined so as to emit light having desired wavelengths. As an example, in this exemplary embodiment, the second conductivity type semiconductor layer 125 may be a p-type semiconductor layer.

The mesa 120m is disposed on some region of the first conductivity type semiconductor layer 121 such that an upper surface of the first conductivity type semiconductor layer 121 can be exposed in a region in which the mesa 120m is not formed. The mesa 120m may be formed by partially etching the second conductivity type semiconductor layer 125 and the active layer 123. Although the mesa 120m may have any shape, for example, the mesa 120m may be formed along the side of the first conductivity type semiconductor layer 121, as shown in the drawings. The mesa 120m may have an inclined side surface or a perpendicular side surface perpendicular to the upper surface of the first conductivity type semiconductor layer 121. The upper surface of the first conductivity type semiconductor layer 121 may include a region in which the mesa 120m is not formed and the first electrode 150 is formed.

The mesa 120m may further include a roughness pattern (not shown) on a side surface thereof. Furthermore, the first conductivity type semiconductor layer 121 and the substrate 110 may include roughness patterns (not shown) on side surfaces thereof. The roughness pattern may be formed by dry etching and/or wet etching. The roughness pattern may be formed in a manufacturing process of the light emitting element by an isolation process which is performed to isolate individual elements from a wafer. With this structure, the light emitting element can have improved light extraction efficiency. The drawings show the light emitting structure having a lateral structure as an example. Alternatively, the light emitting structure may have other structures, for example, the vertical structure. In a light emitting element having another structure (for example, vertical structure) instead of the lateral structure as shown in the drawings, the upper surface of the first conductivity type semiconductor layer 121 may not be exposed.

The current blocking layer 130 may be at least partially disposed on the second conductivity type semiconductor layer 125. The current blocking layer 130 may be disposed on the second conductivity type semiconductor layer 125 at a location corresponding to the second electrode 160. The current blocking layer 130 may include a pad current blocking layer 131 and an extension portion current blocking layer 133. The pad current blocking layer 131 and the extension portion current blocking layer 133 may be disposed corresponding to a second electrode pad 161 and a second electrode extension portion 163, respectively. Accordingly, as shown in the drawings, the pad current blocking layer 131 is disposed adjacent to the first side surface 101 of the light emitting element and the extension portion current blocking layer 133 may be disposed to extend form the first side surface 101 towards the third side surface 103.

The current blocking layer 130 can prevent current crowding by preventing electric current supplied to the second electrode 160 from being directly transferred to the semiconductor layers. Accordingly, the current blocking layer 130 may include an insulating material to have insulating properties and may be composed of or include a single layer or multiple layers. For example, the current blocking layer 130 may include $SiO_x$ or $SiN_x$, or may include a distributed Bragg reflector in which insulating material layers having different indices of refraction are stacked one above another. The current blocking layer 130 may exhibit light transmittance, light reflectivity, or selective light reflectivity. Further, the current blocking layer 130 may have a larger area than the second electrode 160 formed on the current blocking layer 130. Accordingly, the second electrode 160 may be disposed in a region in which the current blocking layer 130 is formed. Furthermore, the current blocking layer 130 may have an inclined side surface to avoid peeling of the transparent electrode 140 at a corner (for example, an angled portion) of the current blocking layer 130 and/or electrical disconnection.

The transparent electrode 140 may be disposed on the second conductivity type semiconductor layer 125 and cover a portion of an upper surface of the second conductivity type semiconductor layer 125 and a portion of the current blocking layer 130. The transparent electrode 140 may include an opening that partially exposes the pad current blocking layer 131. The opening may be disposed on the pad current blocking layer 131 and the transparent electrode 140 may partially cover the pad current blocking layer 131. Furthermore, a side surface of the opening may be formed substantially along the side surface of the pad current blocking layer 131. Accordingly, a portion of the transparent electrode 140 may be interposed between the second electrode pad 161 and the pad current blocking layer 131 to contact the second electrode pad 161. Further, the transparent electrode 140 may cover the extension portion current blocking layer 133 and thus contact the second electrode extension portion 163 disposed on the extension portion current blocking layer 133. In some exemplary embodiments, the opening may expose the entirety of the pad current blocking layer 131. In these exemplary embodiments, the second electrode pad 161 may be separated from the transparent electrode 140. Furthermore, the transparent electrode 140 may form ohmic contact with the second conductivity type semiconductor layer 125.

The transparent electrode 140 may be formed of or include a light transmissive and electrically conductive material, for example, a conductive oxide or a light transmissive metal. For example, in this exemplary embodiment, the transparent electrode 140 may be or include a ZnO transparent electrode formed of or including zinc oxide (ZnO). The ZnO transparent electrode has better light transmittance than an ITO transparent electrode and may be formed to a greater thickness than the ITO transparent electrode. The ITO transparent electrode having a thickness of 200 nm or more has low light transmittance, thereby providing a high light absorption rate. On the other hand, since the ZnO transparent electrode has better light transmittance, the ZnO transparent electrode can be formed to a thickness of about 250 nm or more. Furthermore, even when the ZnO transparent electrode is formed to a thickness of several micrometers, the light absorption rate of the ZnO transparent electrode does not significantly increase, thereby improving light extraction efficiency of the light emitting element. As such, the ZnO transparent electrode can be formed to a relatively large thickness, thereby allowing more uniform lateral current spreading in the light emitting element to which the ZnO transparent electrode is applied, while reducing forward voltage (Vf) thereof, as compared with the forward voltage Vf of the light emitting element to which the ITO transparent electrode is applied.

In the following exemplary embodiments, the ZnO transparent electrode will be described as the transparent electrode 140. The transparent electrode 140 will be described in more detail with reference to the accompanying drawings.

As shown in FIG. 2 to FIG. 7, the transparent electrode 140 includes a first region 141 and a second region 142. The first region 141 may include a plurality of protrusions 141p protruding upwards from an upper surface of the transparent electrode 140 and arranged in a predetermined pattern. The protrusions 141p protrude along a direction away from the upper surface of the transparent electrode 140. Thus, a region in which the protrusions 141p are not formed corresponds to the second region 142.

The protrusions 141p may be separated from one another and may be arranged to have a predetermined pattern. For example, as shown in FIG. 5 to FIG. 7, the protrusions 141p may be arranged in a pattern. For example, the centers of the protrusions are disposed at vertexes that are separated by a uniform distance. The protrusions can have various shapes including, for example, polygonal, pyramid, or cone shapes. The protrusions are arranged such that the same or different shapes of protrusions are repeatedly arranged in a pattern. It should be understood that the protrusions can be implemented in various manners and the arrangement of the protrusions, for example, the arrangement of the centers of the protrusions 141p, can be modified in various ways.

The transparent electrode formed of ITO and having a thickness of several dozens to several hundreds of nanometers can cause significant deterioration in luminous efficacy of the light emitting element due to light absorption thereof. According to this exemplary embodiment, since the transparent electrode 140 includes the ZnO transparent electrode, the transparent electrode 140 can be formed to have a greater thickness than the transparent electrode formed of ITO, thereby allowing the plurality of protrusions 141p to be arranged on the upper surface of the ZnO transparent electrode. When the transparent electrode 140 includes the protrusions 141p, the probability of total reflection on the surface of the transparent electrode 140 is reduced, thereby improving light extraction efficiency with respect to light passing through the transparent electrode 140.

Figure 8:
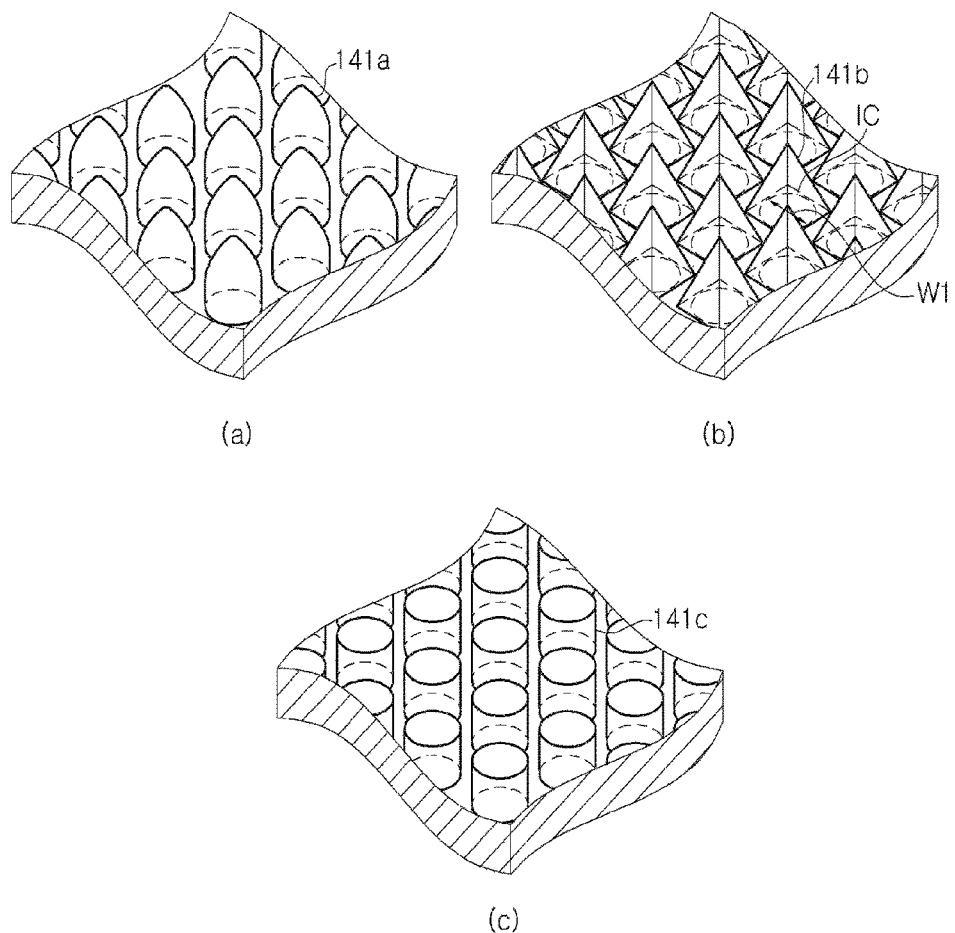
FIGS. 8 (a) to (c) are enlarged perspective views of an exemplary light emitting element according to another exemplary embodiment of the present disclosure.

In some implementations, each of the protrusions 141p may have a conical shape, a horizontal area of which gradually decreases from the bottom thereof to the top thereof. Here, a lower surface of the protrusion 141p of the conical shape may have a substantially circular shape and a side surface of the protrusion 141p may include a curved surface having a gradually decreasing tangential inclination. The protrusions 141p may have various shapes, as shown in FIG. 8. Referring to FIG. 8(a), protrusions 141a may have a bullet shape, in which the side surface of the protrusions 141a may include a curved surface having a gradually decreasing tangential inclination and a substantially perpendicular surface perpendicular to a lower surface of the protrusion 141a. The lower surface of the protrusion 141a may have a substantially circular shape. Referring to FIG. 8(b), protrusions 141b may be formed in a poly-pyramidal shape, for example, a quadrangular pyramidal shape. In this structure, the side surface of each of the protrusions 141b may include a substantially flat surface or may include a curved surface having a certain radius of curvature. The lower surface of the protrusion 141b may have a polygonal shape, in which the polygon of the lower surface may have an imaginary inscribed circle IC. In the structure wherein the lower surface of the protrusion 141b has a polygonal shape, the diameter of the lower surface is defined as the diameter of the inscribed circle IC of the polygonal shape. Further, referring to FIG. 8(c), the protrusions 141c may be formed in a conical or poly-pyramidal shape, for example, a conical shape having a side surface substantially perpendicular to a lower surface thereof. The shape of the protrusions 141p according to the exemplary embodiments is not limited to the shapes described above and may be modified in various ways.

The first region 141 may have a different thickness than the second region 142. The maximum thickness T3 of the first region 141 may be substantially equal to the sum of the thickness T1 of the second region 142 and the height T2 (or thickness corresponding to the height) of the protrusions 141p. The maximum thickness T3 of the first region 141 may be about two to six times the thickness T1 of the second region 142. Here, the second region 142 may have a thickness T1 of about 250 nm or more, for example, 300 nm to 500 nm. Within this thickness range of the second region 142, electrical resistance within the transparent electrode 140 can be sufficiently reduced in the horizontal direction. Accordingly, the second region 142 can be prevented from acting as an electrical resistor, thereby improving lateral current spreading efficiency in the transparent electrode 140.

The thickness T2 of the protrusions 141p may be greater than the thickness T1 of the second region 142 and may be, for example, about 0.5 μm to about 2.5 μm, for example, about 1 μm to about 1.5 μm. Furthermore, the diameter W1 of the lower surface of each protrusion 141p (or the diameter of the inscribed circle of the polygonal shape corresponding to the lower surface of the protrusion (see FIG. 8(b)) may be about 0.5 μm to 4 μm, for example, about 1 μm to 3 μm. Within these ranges of diameter W1 and height T2, the protrusions 141p can maximize efficiency in prevention of total internal reflection therethrough, thereby improving light extraction efficiency of the light emitting element. Furthermore, a separation distance D1 between the protrusions 141p may be smaller than the diameter W1 of the lower surface of each of the protrusions 141p. For example, W1 may be 1.5 to 3 times D1. Within this range of separation distance D1 between the protrusions 141p, it is possible to prevent deterioration in light extraction efficiency by interference or absorption of light passing through one protrusion 141p by another protrusion 141p adjacent thereto and to prevent deterioration in lateral current spreading efficiency by current crowding in the protrusions 141p when electric current flows in the transparent electrode 140 in the horizontal direction.

Further, the shortest distance D2 from the second electrode extension portion 163 to one protrusion 141p adjacent the second electrode extension portion 163 in the horizontal direction is greater than the separation distance D1 between the protrusions 141p. If D2<D1, electric current supplied to the transparent electrode 140 through the second electrode extension portion 163 can crowd in the protrusions 141p having relatively low electrical resistance (great thickness) and adjacent thereto. Accordingly, current crowding occurs in the protrusions 141p adjacent the second electrode extension portion 163, thereby causing deterioration in current spreading efficiency. According to the exemplary embodiment, under the above condition of D2, electric current can be efficiently spread through the second region 142 and regions under the protrusions 141p in the horizontal direction. Furthermore, if D2<D1, the separation distance between the protrusions 141p adjacent the second electrode extension portion 163 and the second electrode extension portion 163 is too small, thereby causing deterioration in luminous efficacy through absorption of light by the second electrode extension portion 163 when light is emitted through the protrusions 141p adjacent the second electrode extension portion 163. According to this exemplary embodiment, it is possible to improve luminous efficacy of the light emitting element by suppressing light absorption by the second electrode extension portion 163.

With the structure of D2>D1, the first region 141 of the transparent electrode 140 does not overlap a region R1 surrounded by the side surface of the second electrode extension portion 163 and an imaginary boundary separated by a predetermined distance from the side surface of the second electrode extension portion 163 in the horizontal direction. As shown in FIG. 5 and FIG. 6, the region R1 may be defined as a region separated by a distance D3 from the side surface of the second electrode extension portion 163 and the protrusions 141p are not disposed in the region R1. In some implementations, D3 may be greater than D1 and D2 may be greater than or equal to D3. In this way, the location of the first region 141 is set to prevent the protrusions 141p from being disposed in the region R1, thereby improving current spreading efficiency around the second electrode extension portion 163.

With this approach, the locations of the first region 141 and the protrusions 141p on the transparent electrode 140 can be determined to be advantageously applied to the process of forming the protrusions 141p. For example, the protrusions 141p may be formed by masking the region R1 with a mask, in which the region R1 is surrounded by the side surface of the second electrode extension portion 163 and the imaginary boundary separated by a predetermined distance D3 from the side surface of the second electrode extension portion 163 in the horizontal direction, followed by an etching. Accordingly, it is possible to easily control the distance D3 and the locations of the protrusions 141p through a simple method to make D2 greater than D1.

On the other hand, a thickness T4 of the transparent electrode 140 disposed under the second electrode extension portion 163 may be greater than an average thickness of the transparent electrode 140. The thickness T4 may be greater than the thickness T2 of the second region 142. In addition, the thickness T4 may be substantially similar to the maximum thickness T3 of the first region 141. A portion of the transparent electrode 140 contacting the second electrode extension portion 163 may be formed to have a relatively great thickness to improve current injection efficiency from the second electrode extension portion 163 to the transparent electrode 140. Further, since current crowding occurs in a portion of the transparent electrode 140 disposed under the second electrode extension portion 163 due to direct current injection from the second electrode extension portion 163, the portion of the transparent electrode 140 disposed under the second electrode extension portion 163 is formed to have a relatively great thickness, thereby improving current spreading efficiency. Likewise, a portion of the transparent electrode 140 disposed under the second electrode pad 161 may have a similar thickness to the thickness T4.

The transparent electrode 140 including the first region 141, the second region 142 and the protrusions 141p with the aforementioned ranges and conditions can be realized using a ZnO transparent electrode as the transparent electrode 140. With this structure, the light emitting element can have good efficiency in light extraction and current spreading while reducing forward voltage.

Next, a method of forming the transparent electrode 140 will be described by way of example. First, a ZnO seed layer is formed on the second conductivity type semiconductor layer 125. The ZnO seed layer may be formed by a deposition process such as spin coating. Here, the ZnO seed layer formed by spin coating may be formed to a thickness of several nanometers. Then, the ZnO seed layer is subjected to heat treatment to form ohmic contact between the ZnO seed layer and the second conductivity type semiconductor layer 125. Heat treatment may be performed at a temperature of about 500° C. in an $N_2$ atmosphere. Next, a ZnO single crystal or polycrystal layer is grown on the ZnO seed layer to form a ZnO transparent electrode. For example, a single crystal ZnO transparent electrode may be formed by hydrothermal synthesis. Here, the ZnO transparent electrode may be formed to a thickness of about 1 μm to about 4 μm and may be adjusted depending upon the height of the protrusions 141p and the thickness of the second region 142. Heat treatment may be further performed on the ZnO transparent electrode formed by hydrothermal synthesis. Next, a mask is formed on the ZnO transparent electrode, which in turn is partially removed to form a plurality of protrusions 141p through an etching process. The etching process may include dry etching. The region covered by the mask may include a region in which the second electrode 160 will be formed, the region R1, and a region in which the protrusions 141p will be formed. The mask disposed on the region in which the protrusions 141p will be formed may have a side slope formed through, for example, photoresist reflow, thereby forming a slope of sides of the protrusions 141p. In this way, the region in which the second electrode 160 will be formed is covered by the mask, whereby the thickness T4 can become greater than the average thickness of the transparent electrode 140.

Referring again to FIG. 1 to FIG. 7, the first electrode 150 is electrically connected to the first conductivity type semiconductor layer 121. The first electrode 150 may be electrically connected to the first conductivity type semiconductor layer 121 through ohmic contact with an upper surface of the first conductivity type semiconductor layer 121 exposed by partially removing the second conductivity type semiconductor layer 125 and the active layer 123. Thus, the first electrode 150 may be disposed on a region of the first conductivity type semiconductor layer 121 exposed around the mesa 120m. The first electrode 150 may include a first electrode pad 151 and at least one first electrode extension portion 153. The first electrode 150 may serve to supply external power to the first conductivity type semiconductor layer 121 and include a metallic material, such as Ti, Pt, Au, Cr, Ni, Al, or others. Further, the first electrode 150 may be composed of a single layer or multiple layers.

The first electrode pad 151 may be disposed near the third side 103 of the light emitting element and two first electrode extended portions 153 extend from the first electrode pad 151 toward the first side 101 of the light emitting element. Considering current spreading efficiency, the first electrode extended portions 153 may extend while being separated a suitable distance from each other.

The second electrode 160 is disposed on the second conductivity type semiconductor layer 125. At least part of the second electrode 160 may be disposed on a region in which the current blocking layer 130 is disposed. The second electrode 160 includes a second electrode pad 161 and at least one second electrode extension portion 163, which may be disposed on the pad current blocking layer 131 and the extension portion current blocking layer 133, respectively. Accordingly, a portion of the transparent electrode 140 may be interposed between the second electrode 160 and the current blocking layer 130. The second electrode pad 161 may be disposed on the opening of the transparent electrode 140. The second electrode pad 161 may contact the transparent electrode 140 and the side surface of the opening of the transparent electrode 140 may at least partially contact the second electrode pad 161. Although the location of the second electrode pad 161 is not limited to a particular location, the second electrode pad 161 may be disposed such that light can be emitted from the entirety of the active layer 123 of the light emitting element through efficient current spreading. For example, as shown in the drawings, the second electrode pad 161 may be disposed adjacent to the first side 101 opposite the third side 103, to which the first electrode pad 151 is adjacent.

The second electrode extension portions 163 extend from the second electrode pad 161. In this exemplary embodiment, three second electrode extension portions 163 may extend from the second electrode pad 161 towards the third side 103. In addition, the extension direction of the second electrode extension portions 163 may vary as the second electrode extension portions 163 extend. For example, a distal end of the second electrode extension portion 163 may be bent toward the first electrode pad 151. This structure can be modified in various ways in consideration of the distance between the first electrode 150 and the second electrode extension portions 163. The transparent electrode 140 is interposed between at least part of the second extension portion 163 and the extension portion current blocking layer 133 so that the second electrode extension portion 163 contacts the transparent electrode 140 to be electrically connected thereto.

The first electrode extension portions 153 and the second electrode extension portions 163 are disposed relative to each other. In some implementations, the first electrode extension portion 153 and the second electrode extension portion 163 are disposed to interlock with each other. For example, referring to FIG. 1, each of the first electrode extension portions 153 may be interposed between two second electrode extension portions 163 and the second electrode extension portions 163 between the two electrode extension portions 163 may be disposed between the two first electrode extension portions 153. Here, the shortest distances between the adjacent first electrode extension portions 153 and the second electrode extension portions 163 may be substantially the same.

It should be understood that the arrangement of the first and second electrodes 150, 160 is not limited thereto and can be modified and changed in various ways depending upon the shape of the light emitting element.

The second electrode 160 may include metals, such as Ti, Pt, Au, Cr, Ni, or Al, and may be composed of a single layer or multiple layers. For example, the second electrode 160 may include at least one metal stack structure selected from among or including Ti/Au layers, Ti/Pt/Au layers, Cr/Au layers, Cr/Pt/Au layers, Ni/Au layers, Ni/Au layers, Ni/Pt/Au layers, or Cr/Al/Cr/Ni/Au layers.

Figure 9:
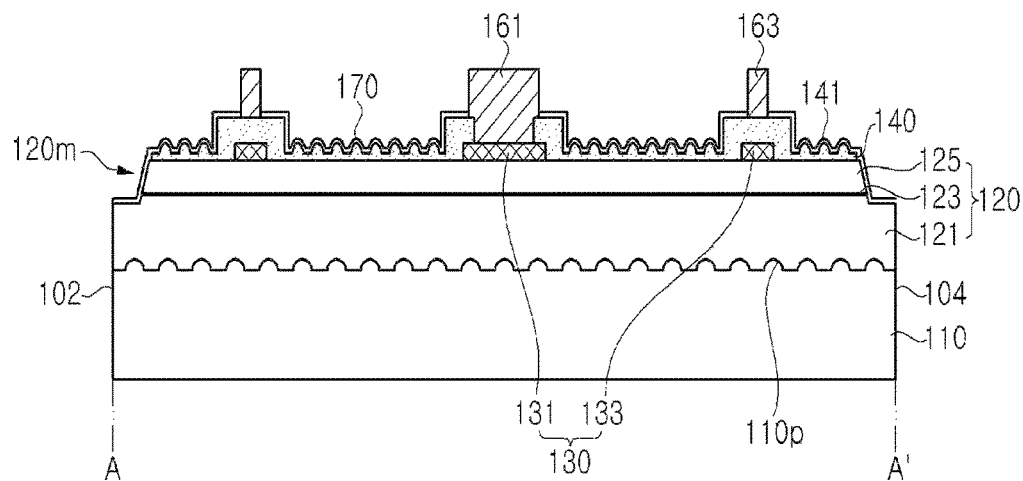
FIG. 9 and FIG. 10 are a cross-sectional view and an enlarged cross-sectional view of an exemplary light emitting element according to another exemplary embodiment of the present disclosure.
Figure 10:
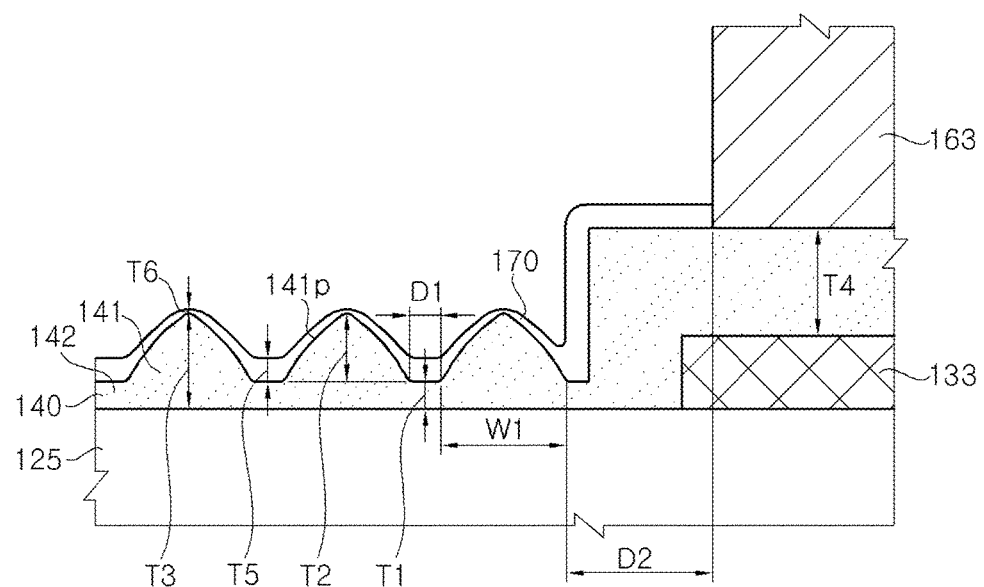

FIG. 9 and FIG. 10 are a cross-sectional view and an enlarged cross-sectional view of a light emitting element according to other exemplary embodiments of the present disclosure. FIG. 10 is an enlarged cross-sectional view of a portion of the light emitting element shown in FIG. 9. The light emitting element according to this exemplary embodiment further includes a passivation layer 170 in addition to the features of the light emitting element shown in FIG. 1 to FIG. 7. The following description will focus on the difference in structure of the light emitting element according to this exemplary embodiment, and detailed description of the same features will be omitted.

Referring to FIG. 9 and FIG. 10, the light emitting element includes a light emitting structure 120, a current blocking layer 130, a transparent electrode 140, a first electrode 150, a second electrode 160, and a passivation layer 170. The light emitting element may further include a substrate 110. In addition, the light emitting element may include first to fourth side surfaces 101, 102, 103, 104. The light emitting element may have a rectangular shape with different aspect ratios in a plan view, as shown in the drawings, without being limited thereto.

The passivation layer 170 may cover an upper surface of the transparent electrode 140 and further cover an upper surface of the light emitting structure 120. Accordingly, a side surface of the mesa 120m may be covered by the passivation layer 170 and the active layer 123 exposed along the side surface of the mesa 120m may be effectively protected from an external environment.

The passivation layer 170 may protect the light emitting element from the outside and may be further formed on the transparent electrode 140 to form a refractive index grading layer. For example, the passivation layer 170 may have a lower index of refraction than the ZnO transparent electrode. The passivation layer 170 may be formed of an insulating transparent material, such as $SiO_2$, $SiN_x$, $MgF_2$, and the like. In particular, when the passivation layer 170 includes a SiNx layer, the light emitting element can be effectively protected from moisture.

The passivation layer 170 may be composed of a single layer or multiple layers. The passivation layer 170 may include a distributed Bragg reflector in which plural layers having different indices of refraction are stacked one above another. Materials, thickness of each layer and a stacking cycle of the distributed Bragg reflector may be determined so as to transmit light emitted from the light emitting structure 120 while reflecting light having a longer wavelength than the light emitted from the light emitting structure 120. For example, when a wavelength converter (not shown) is formed on the light emitting element, the passivation layer 170 may include a distributed Bragg reflector that transmits light emitted from the light emitting structure 120 while reflecting light subjected to wavelength conversion by the wavelength converter.

The thickness of the passivation layer 170 disposed on the transparent electrode 140 may vary. Referring to FIG. 10, a thickness T5 of the passivation layer 170 on the second region 142 of the transparent electrode 140 may be greater than a thickness T6 of the passivation layer 170 on the first region 141. The passivation layer 170 disposed on the first region 141 may decrease in thickness from the bottom to the top of the side surfaces of the protrusions 141p. Accordingly, the roughness pattern on the upper surface of the passivation layer 170 can be formed in a gentle slope, as compared with the roughness pattern formed by the protrusions 141p of the transparent electrode 140. With this structure, the light emitting element can further reduce the probability of total internal reflection of light passing through the transparent electrode 140 and the passivation layer 170, thereby further improving light extraction efficiency.

Figure 11:
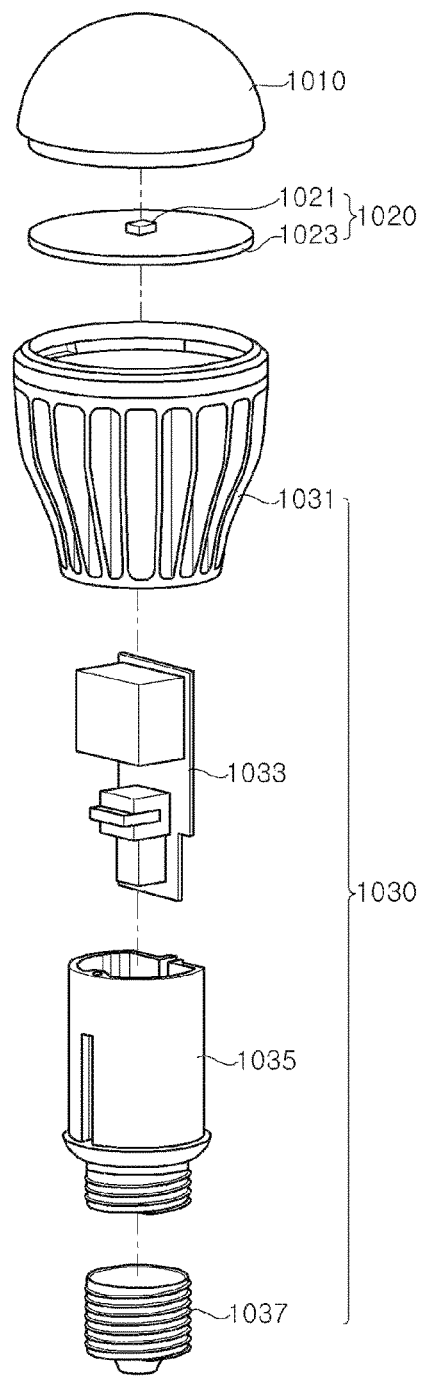
FIG. 11 is an exploded perspective view of one embodiment of a lighting apparatus to which a light emitting element according to one exemplary embodiment of the present disclosure is applied.

FIG. 11 is an exploded perspective view of one embodiment of a lighting apparatus to which a light emitting element according to one exemplary embodiment is applied.

Referring to FIG. 11, the lighting apparatus according to this embodiment includes a diffusive cover 1010, a light emitting module 1020, and a body 1030. The body 1030 may receive the light emitting module 1020 and the diffusive cover 1010 may be disposed on the body 1030 to cover an upper side of the light emitting module 1020.

The body 1030 may have any shape so long as the body can supply electric power to the light emitting module 1020 while receiving and supporting the light emitting module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting module 1020, and may include at least one IC chip. The IC chip may regulate, change or control electric power supplied to the light emitting module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting module 1020 includes a substrate 1023 and a light emitting element 1021 disposed on the substrate 1023. The light emitting module 1020 may be disposed at an upper portion of the body case 1031 and electrically connected to the power supply 1033.

As the substrate 1023, any substrate capable of supporting the light emitting element 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting element 1021 may include at least one of the light emitting elements according to the exemplary embodiments described above.

The diffusive cover 1010 is disposed on the light emitting element 1021 and may be secured to the body case 1031 to cover the light emitting element 1021. The diffusive cover 1010 may be formed of or include a light-transmitting material and light orientation of the lighting apparatus may be adjusted through regulation of the shape and optical transmissivity of the diffusive cover 1010. Thus, the diffusive cover 1010 may be modified in various shapes depending on usage and applications of the lighting apparatus.

Figure 12:
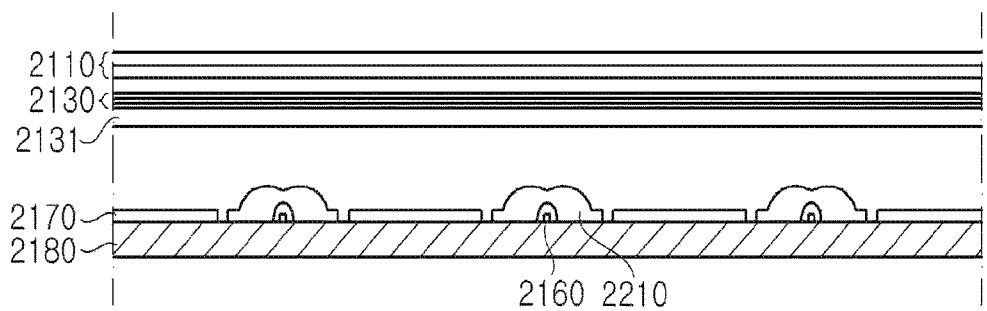
FIG. 12 is a cross-sectional view of one embodiment of a display to which a light emitting element according to one exemplary embodiment of the present disclosure is applied.

FIG. 12 is a cross-sectional view of one embodiment of a display apparatus to which a light emitting element according to one exemplary embodiment of the present disclosure is applied.

The display apparatus according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on or include a thin film transistor substrate instead of being formed on separate PCBs.

The backlight unit includes a light source module which includes at least one substrate 2150 and a plurality of light emitting elements 2160. The backlight unit may further include a bottom cover 2180, a reflective sheet 2170, a diffusive plate 2131, and optical sheets 2130.

The bottom cover 2180 may be open at an upper side thereof to receive the substrate 2150, the light emitting elements 2160, the reflective sheet 2170, the diffusive plate 2131, and the optical sheets 2130. In addition, the bottom cover 2180 may be coupled to the panel guide. The substrate 2150 may be disposed under the reflective sheet 2170 to be surrounded by the reflective sheet 2170. Alternatively, when a reflective material is coated on a surface thereof, the substrate 2150 may be disposed on the reflective sheet 2170. Further, a plurality of substrates 2150 may be arranged parallel to one another, without being limited thereto. However, it should be understood that the backlight unit includes a single substrate 2150.

The light emitting elements 2160 may include at least one of the light emitting elements according to the exemplary embodiments described above. The light emitting elements 2160 may be regularly arranged in a predetermined pattern on the substrate. In addition, a lens 2210 may be disposed on each of the light emitting elements 2160 to improve uniformity of light emitted from the plurality of light emitting elements 2160.

The diffusive plate 2131 and the optical sheets 2130 are disposed above the light emitting element 2160. Light emitted from the light emitting elements 2160 may be supplied in the form of sheet light to the display panel 2110 through the diffusive plate 2131 and the optical sheets 2130.

In this way, the light emitting elements according to the exemplary embodiments may be applied to direct type displays like the display apparatus according to this embodiment.

Figure 13:
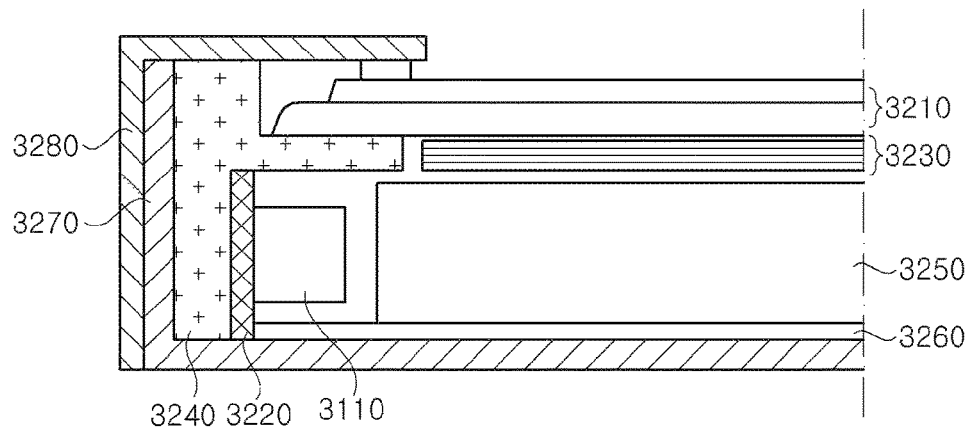
FIG. 13 is a cross-sectional view of another embodiment of a display to which a light emitting element according to one exemplary embodiment of the present disclosure is applied.

FIG. 13 is a cross-sectional view of another embodiment of the display apparatus to which a light emitting element according to one exemplary embodiment of the present disclosure is applied.

The display apparatus according to this embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting elements 3110 arranged at constant intervals on one surface of the substrate 3220. As the substrate 3220, any substrate capable of supporting the light emitting elements 3110 and being electrically connected thereto may be used without limitation. For example, the substrate 3220 may include a printed circuit board. The light emitting elements 3110 may include at least one of the light emitting elements according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting elements 3110 into sheet light.

In this way, the light emitting elements according to the exemplary embodiments may be applied to edge type displays like the display apparatus according to this exemplary embodiment.

Figure 14:
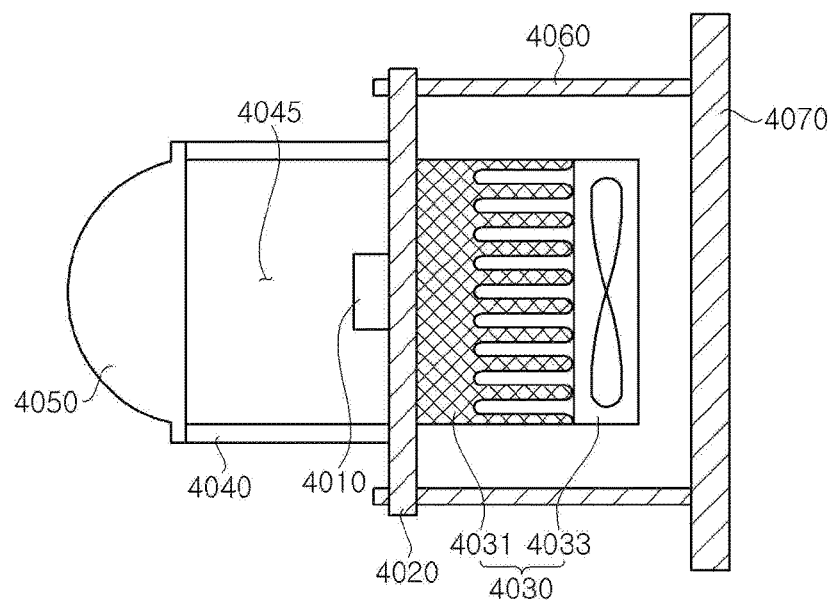
FIG. 14 is a cross-sectional view of a headlight to which a light emitting element according to one exemplary embodiment of the present disclosure is applied.

FIG. 14 is a cross-sectional view of a headlight to which a light emitting element according to one exemplary embodiment of the present disclosure is applied.

Referring to FIG. 14, the headlight according to this embodiment includes a lamp body 4070, a substrate 4020, a light emitting element 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting element 4010 may be used without limitation. For example, the substrate 4020 may include a substrate having a conductive pattern, such as a printed circuit board. The light emitting element 4010 is disposed on the substrate 4020 and may be supported and secured by the substrate 4020. In addition, the light emitting element 4010 may be electrically connected to an external power source through the conductive pattern of the substrate 4020. Further, the light emitting element 4010 may include at least one of the light emitting elements according to the exemplary embodiments described above.

The cover lens 4050 is disposed on a path of light emitted from the light emitting element 4010. For example, as shown in the drawing, the cover lens 4050 may be spaced apart from the light emitting element 4010 by the connection member 4040 and may be disposed in a direction of supplying light emitted from the light emitting element 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting element 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting element 4010.

In this way, the light emitting elements according to the exemplary embodiment may be applied to headlights, particularly, headlights for vehicles, like the headlight according to this embodiment.

Although some exemplary embodiments have been described herein, it should be understood that various modifications, changes, alterations, and equivalent embodiments can be made by those skilled in the art within the scope of the present disclosure.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed is:

1. A light emitting element comprising:
   a first conductivity type semiconductor layer;
   a mesa disposed on the first conductivity type semiconductor layer and comprising an active layer and a second conductivity type semiconductor layer disposed on the active layer;
   a ZnO transparent electrode disposed on the mesa;
   a first electrode disposed on the first conductivity type semiconductor layer; and
   a second electrode at least partially disposed on the ZnO transparent electrode, and comprising a second electrode pad and at least one second electrode extension portion extending from the second electrode pad,
   wherein the at least one second electrode extension portion contacts the ZnO transparent electrode,
   the ZnO transparent electrode comprises a first region and a second region, the first region comprising a plurality of protrusions protruding upwards from an upper surface of the ZnO transparent electrode and arranged in a predetermined pattern,
   the first region having a thickness greater than that of the second region, and
   a separation distance between the plural protrusions is smaller than the shortest distance between the at least one second electrode extension portion and one protrusion adjacent to the at least one second electrode extension portion in a horizontal direction.

2. The light emitting element according to claim 1, wherein a thickness of the first region of the ZnO transparent electrode is two to six times a thickness of the second region of the ZnO transparent electrode.

3. The light emitting element according to claim 1, wherein the second region of the ZnO transparent electrode has a thickness of 250 nm or more.

4. The light emitting element according to claim 1, wherein the second region of the ZnO transparent electrode has a thickness of 300 nm to 500 nm.

5. The light emitting element according to claim 1, wherein the protrusions of the ZnO transparent electrode have a thickness of 1 µm to 1.5 µm.

6. The light emitting element according to claim 1, wherein a diameter of a lower surface of each of the protrusions or an inscribed circle in the lower surface of each of the protrusions is 1.5 to 3 times the separation distance between the protrusions.

7. The light emitting element according to claim 1, wherein a diameter of a lower surface of each of the protrusions or an inscribed circle in the lower surface of each of the protrusions has a diameter of 1 µm to 3 µm.

8. The light emitting element according to claim 1, wherein a portion of the ZnO transparent electrode disposed under the at least one second electrode extension portion has a greater thickness than an average thickness of the ZnO transparent electrode.

9. The light emitting element according to claim 8, wherein a portion of the ZnO transparent electrode disposed under the at least one second electrode extension portion has the same thickness as the first region of the ZnO transparent electrode.

10. The light emitting element according to claim 1, further comprising:
a current blocking layer interposed between the mesa and the ZnO transparent electrode,
wherein the current blocking layer comprises a pad current blocking layer disposed under the second electrode pad and an extension portion current blocking layer disposed under the at least one second electrode extension portion.

11. The light emitting element according to claim 10, wherein
the extension portion current blocking layer is covered by the ZnO transparent electrode,
the pad current blocking layer is partially covered by the ZnO transparent electrode, and
a portion of the ZnO transparent electrode is interposed between the second electrode pad and the pad current blocking layer.

12. The light emitting element according to claim 11, wherein the portion of the ZnO transparent electrode interposed between the second electrode pad and the pad current blocking layer has a greater thickness than an average thickness of the ZnO transparent electrode.

13. The light emitting element according to claim 1, further comprising:
a passivation layer covering at least part of an upper surface of the light emitting structure and the ZnO transparent electrode.

14. The light emitting element according to claim 13, wherein a portion of the passivation layer disposed on the second region of the ZnO transparent electrode has a greater thickness than a portion of the passivation layer disposed on the first region of the ZnO transparent electrode.

15. The light emitting element according to claim 1, wherein the second region corresponds to a portion of the ZnO transparent electrode on which the protrusions are not formed.

16. A light emitting element comprising:
a first conductivity type semiconductor layer;
a mesa disposed on the first conductivity type semiconductor layer, and comprising an active layer and a second conductivity type semiconductor layer disposed on the active layer;
a ZnO transparent electrode disposed on the mesa;
a first electrode insulated from the second conductivity type semiconductor layer and disposed on the first conductivity type semiconductor layer; and
a second electrode at least partially disposed on the ZnO transparent electrode, and comprising a second electrode pad and at least one second electrode extension portion extending from the second electrode pad,
wherein the at least one second electrode extension portion contacts the ZnO transparent electrode, and
the ZnO transparent electrode comprises a first region and a second region,
the first region comprising a plurality of protrusions protruding upwards from an upper surface of the ZnO transparent electrode and arranged in a predetermined pattern,
the first region not overlapping a region surrounded by a side surface of the at least one second electrode extension portion and an imaginary boundary separated by a predetermined distance from the side surface of the at least one second electrode extension portion in a horizontal direction, the predetermined distance being greater than a separation distance between the protrusions.

17. The light emitting element according to claim 16, wherein the second region has a smaller thickness than a height of the plurality of protrusions.

18. The light emitting element according to claim 16, wherein the predetermined distance is smaller than or equal to a distance from the at least one second electrode extension portion to one protrusion adjacent to the at least one second electrode extension portion in a horizontal direction.

* * * * *